United States Patent [19]

Lammert

[11] Patent Number: 5,486,483
[45] Date of Patent: Jan. 23, 1996

[54] METHOD OF FORMING CLOSELY SPACED METAL ELECTRODES IN A SEMICONDUCTOR DEVICE

[75] Inventor: Michael D. Lammert, Manhattan Beach, Calif.

[73] Assignee: TRW Inc., Redondo Beach, Calif.

[21] Appl. No.: 312,845

[22] Filed: Sep. 27, 1994

[51] Int. Cl.⁶ ................................ H01L 21/265
[52] U.S. Cl. .................... 437/39; 437/405; 437/912
[58] Field of Search ................ 437/31, 203, 189, 437/40, 80, 944, 31, 40 SH, 40 RC, 944, 41 SH, 39, 912, 174, 175; 148/DIG. 139, DIG. 140

[56] References Cited

U.S. PATENT DOCUMENTS

| | | | |
|---|---|---|---|
| 3,865,646 | 2/1975 | Logan et al. | 437/107 |
| 4,325,181 | 4/1982 | Yoder | 257/284 |
| 4,700,462 | 10/1987 | Beaubien et al. | 437/40 |
| 4,818,712 | 4/1989 | Tully . | |
| 4,889,824 | 12/1989 | Selle et al. . | |
| 4,959,326 | 9/1990 | Roman et al. | 437/203 |
| 4,996,165 | 2/1991 | Chang et al. . | |
| 4,997,778 | 3/1991 | Sim et al. | 437/40 |
| 5,006,478 | 4/1991 | Kobayashi et al. | 437/41 |
| 5,053,348 | 10/1991 | Mishra et al. | 437/41 |
| 5,086,013 | 2/1992 | Shimizu et al. . | |
| 5,093,280 | 3/1992 | Tully . | |
| 5,124,275 | 6/1992 | Selle et al. . | |
| 5,179,032 | 1/1993 | Quigg . | |
| 5,185,277 | 2/1993 | Tung et al. . | |
| 5,185,278 | 2/1993 | Barker . | |
| 5,223,454 | 6/1993 | Uda et al. . | |
| 5,256,580 | 10/1993 | Gaw et al. . | |
| 5,288,654 | 2/1994 | Kasai et al. | 437/41 |
| 5,288,660 | 2/1994 | Hua et al. . | |
| 5,304,511 | 4/1994 | Sakai . | |
| 5,334,542 | 8/1994 | Saito et al. | 437/203 |

*Primary Examiner*—Olik Chaudhuri
*Assistant Examiner*—Brian K. Dutton

[57] ABSTRACT

A method of forming closely spaced metal electrodes contacting different regions of a semiconductor device is disclosed. The method includes first depositing a sacrificial layer over a developing semiconductor structure. Next, a photoresist layer is deposited over the sacrificial layer and then patterned and developed with a re-entrant profile opening. An opening in the dielectric layer is formed to expose a first semiconductor layer through the re-entrant profile using an anisotropic etch. The photoresist opening is enlarged by removing a portion of the photoresist layer. Then, a metal layer is deposited over the entire structure such that the metal contacts the first semiconductor layer and extends over a portion of the sacrificial layer. The photoresist layer, the sacrificial layer and portions of the first semiconductor layer are removed so that a first metal electrode is connected to a semiconductor region. The first electrode has a lateral extension determined by the amount the photoresist opening is enlarged. The vertical clearance between the first electrode and a second semiconductor layer is determined by the thickness of the sacrificial layer. A second metal electrode is formed by either a conventional lift-off procedure or by a conventional deposition and etch procedure.

20 Claims, 1 Drawing Sheet

5,486,483

METHOD OF FORMING CLOSELY SPACED METAL ELECTRODES IN A SEMICONDUCTOR DEVICE

BACKGROUND OF THE INVENTION

1. Field of the Invention

This invention relates generally to a method for forming metal electrodes on a semiconductor device and, more particularly, to a method for forming closely spaced metal electrodes electrically connected to different layers of a semiconductor device that provides reliable and reproducible vertical and horizontal separation of the electrodes.

2. Discussion of the Related Art

Semiconductor device performance has been continually improving. In order for semiconductor devices to operate at increasing speeds, the size of the devices has been becoming smaller. As the devices become smaller, the spacing between electrodes connected to different regions of the device needs to be closer together. Additionally, in order to realize higher device performance, the contact resistance between an electrode and the region of the device the electrode contacts must be minimized. An electrode metalization process which would provide contact to the entire surface area of a semiconductor region would result in a minimum contact resistance to that region.

Although it is relatively straightforward to provide complete metal electrode coverage to a single semiconductor region, it is much more difficult to metalize adjacent semiconductor regions with complete or nearly complete metal coverage. Clearly, some minimum space between metal electrodes contacting different semiconductor regions is required to prevent electrical shorts. It is therefore difficult to achieve minimum spacing between two metal electrodes with a reliable, reproducible process. Consequently, device performance is limited by the ability of metalization processes in achieving minimum electrode spacing.

Known processes of forming closely spaced metal electrodes in high performance semiconductor devices typically include using a recess of an etched top layer of the semiconductor device to provide the spacing between adjacent contact metal layers forming electrodes for two semiconductor regions. For example, the emitter metal of a heterojunction bipolar transistor (HBT) could be used as a mask to etch the emitter region of the HBT, thus forming a recess for a self-aligned base metalization. If the top layer of a semiconductor device is thin, or the metal contacting an adjacent semiconductor layer, such as the base of an HBT, needs to be of a comparable thickness to that of the emitter region, the spacing between the two metal layers forming the electrodes may be very small resulting in the formation of metal electrodes which are likely to cause short circuits. Increasing the thickness of the top semiconductor layer would provide better separation of the electrodes, but might increase the parasitic resistance of this layer, and thus will reduce the etch reproducibility for forming narrow (sub micron) top semiconductor layer widths.

Further, other known processes of forming closely spaced metal electrodes in high performance semiconductor devices that use dielectric spacer technology are not readily effective with certain contact metals, such as gold, that are difficult to etch by the techniques that are compatible with dielectric spacer technology.

What is needed is a reliable and reproducible process for forming metal electrodes in a high performance semiconductor device which produces minimum separation between an electrode of one semiconductor layer and an electrode for adjacent semiconductor layers that is independent of the semiconductor layer thicknesses or of the metals being used to contact the semiconductor layers. It is therefore an object of the present invention to provide such a process.

SUMMARY OF THE INVENTION

In accordance with the teachings of the present invention, a process for forming closely spaced metal electrodes for adjacent semiconductor layers of a high performance semiconductor device is disclosed. In order to form a metal electrode for a first semiconductor layer of the semiconductor device, a sacrificial layer is first deposited over the semiconductor device. A photoresist is then deposited over the sacrificial layer, and is exposed and developed to form a re-entrant profile opening through the photoresist. The sacrificial layer is anisotropically etched through the re-entrant profile opening to expose the first semiconductor layer so as to provide a region of the first semiconductor layer to be contacted with the metal electrode. The width of the metal electrode and the lateral spacing between a semiconductor region formed from the first semiconductor layer and a metal electrode in contact with a second semiconductor layer are controlled by enlarging the re-entrant profile opening by an isotropic or anisotropic etch of the photoresist. The thickness of the sacrificial layer controls the vertical separation between electrode extensions of the metal electrode in contact with the first semiconductor layer and the metal electrode in contact with the second semiconductor layer. A metalization layer is formed over the developing structure such that metal is deposited on the first semiconductor layer. The photoresist is dissolved to remove the portions of the metal layer which do not form part of the electrode. Next, the sacrificial layer and first semiconductor layer are etched to remove the sacrificial layer and form the semiconductor region from the first semiconductor layer.

To form the metal electrode for the second semiconductor layer of the semiconductor device, a second photoresist is deposited over the structure and a re-entrant profile opening is formed in the second photoresist to define the area which will be metalized to form the electrode for the second semiconductor layer. Metal is deposited over the entire structure such that electrodes are formed in contact with the second semiconductor layer. The second photoresist is dissolved such that metal which was not part of either electrode is removed. Alternatively, the second electrode can be formed by a metal deposition over the entire device, and then using conventional lithography techniques to pattern and etch this electrode by wet or dry etching. This process can be extended to providing metal electrodes for three or more semiconductor layers by covering the first metal electrode with a second sacrificial layer prior to the coating of the second photoresist.

Additional objects, advantages, and features of the present invention will become apparent from the following description and appended claims, taken in conjunction with the accompanying drawings.

DETAILED DESCRIPTION OF THE PREFERRED EMBODIMENTS

The following description of the preferred embodiments concerning fabricating of closely spaced metal electrodes in a high performance semiconductor device is merely exemplary in nature and is in no way intended to limit the invention or its application or uses.

FIGS. 1–5 are profile views of a developing semiconductor structure 10 that show sequential steps in a process for forming closely spaced metal electrodes in a high performance semiconductor device. Although the sequence of steps is novel in nature, each individual step can be performed by known processes in the art and therefore a detailed description of the process of each individual step would not be necessary to enable one of ordinary skill in the art to perform these steps.

Figure 1:
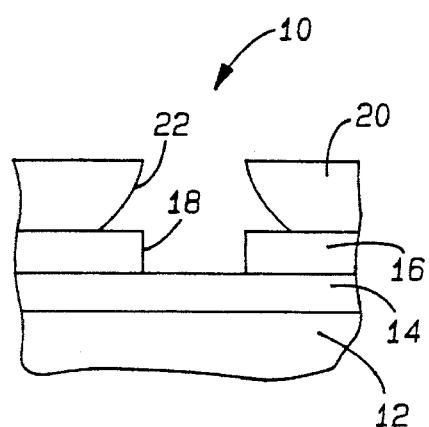
FIGS. 1–5 are profile views of a developing semiconductor structure that show a sequential process of forming adjacent metal electrodes connected to adjacent semiconductor layers in a high performance semiconductor device according to a preferred embodiment of the present invention.

Starting with FIG. 1, a lower semiconductor layer 12 and an upper semiconductor layer 14 are shown. The lower layer 12 could be a base layer and the upper layer 14 could be an emitter layer of an HBT, well known to those skilled in the art. The HBT would obviously include other layers which are not shown, such as a collector layer, and further, at least the emitter layer 14 would include a plurality of emitter layers. It will be appreciated that describing the layer 12 as a base layer and the layer 14 as an emitter layer is just by way of example as the process described below would be applicable to forming closely spaced electrodes for other semiconductor devices. The discussion below will describe a process of forming closely spaced metal contact electrodes to each of the upper and lower semiconductor layers 14 and 12.

A thin sacrificial layer 16 is deposited over the semiconductor layer 14 by a suitable deposition process. The sacrificial layer 16 would typically be a dielectric material, such as silicon nitride ($Si_3N_4$) or silicon dioxide ($SiO_2$); however, any appropriate material that has the property of being able to be etched isotopically and anisotropically with good selectivity to semiconductor material and metal electrodes could also be used. The thickness of the sacrificial layer 16 determines the vertical distance of an electrode contacting the semiconductor layer 14 from an electrode contacting the semiconductor layer 12, as will become apparent from the discussion below.

The sacrificial layer 16 is shown in FIG. 1 as having an opening 18 which exposes the semiconductor layer 14. However, prior to forming the opening 18, a photoresist layer 20 is deposited over the sacrificial layer 16. The photoresist layer 20 can be any applicable photoresist that can be patterned to have a re-entrant or negative profile, such as a chlorobenzene treated liftoff resist or a negative i-line resist, known to those skilled in the art. Once the photoresist layer 20 is deposited over the sacrificial layer 16, the photoresist layer 20 is patterned and developed to form an opening 22 in the photoresist layer 20 having a re-entrant profile in a manner well understood to those skilled in the art. The size of the re-entrant profile opening 22 is approximately equal to the desired metal contact area of the upper semiconductor layer 14 as set by the opening 18. The re-entrant profile opening 22 is a product of the developing step of the photoresist layer 20. Other re-entrant profiles formed by other resists and developing procedures may also be used. Once the re-entrant profile opening 22 is formed in the photoresist layer 20, the sacrificial layer 16 is anisotropically etched through the opening 22, by a procedure such as RIE (reactive ion etching), to expose the upper semiconductor layer 14 in order to generate the profile as shown in FIG. 1.

Figure 2:
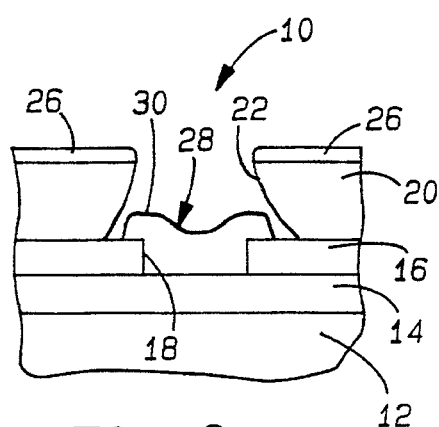

Now turning to FIG. 2, the next steps of the process will be discussed. FIG. 2 shows that the opening 22 in the photoresist layer 20 has been enlarged. This enlarging step can be performed by an oxygen plasma, or other form of dissolving a portion of the photoresist layer 20, to achieve a controlled size increase in the opening 22. The increase in the size of the opening 22 determines the width of electrode wings extending over the sacrificial layer 16, and will later determine the lateral spacing between a semiconductor etched region of the layer 14 and a lower semiconductor layer metal electrode. Next, a metal layer 26 is deposited by an appropriate metalization process, such as evaporation, over the entire developing structure 10 so as to cause a metal electrode 28 to be deposited in contact with the semiconductor layer 14. As is apparent, the electrode 28 includes winged portions 30 which are formed on the top surface of the sacrificial layer 16. The distance between the edge of the opening 18 and the edge of the opening 22 defines the size of the winged portions 30.

Figure 3:
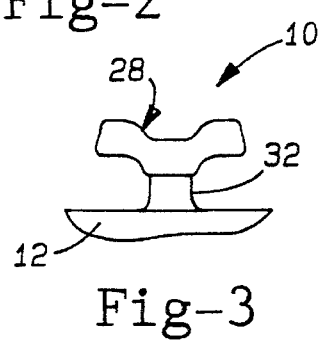

FIG. 3 shows the electrode 28 being positioned in contact with a semiconductor region 32 which was part of the upper semiconductor layer 14. To arrive at this profile, the photoresist layer 20 is dissolved so as to remove the excess portion of the metal layer 26 that was not part of the electrode 28. Next, an isotropic or a combined isotropic/anisotropic etch is performed to remove both the sacrificial layer 16 and the portion of the semiconductor layer 14 which is not part of the semiconductor region 32. As is well understood, an isotropic etch will provide lateral removal of material such that the material beneath the electrode 28 can be removed to form the desired dimension of the semiconductor region 32. Etches of this type are well known in the art and the process of defining the semiconductor region 32 would be well understood. The electrode 28 is used as a mask to define the region 32 for the isotropic or combined isotropic and anisotropic etch of the semiconductor layer 14.

Figure 4:
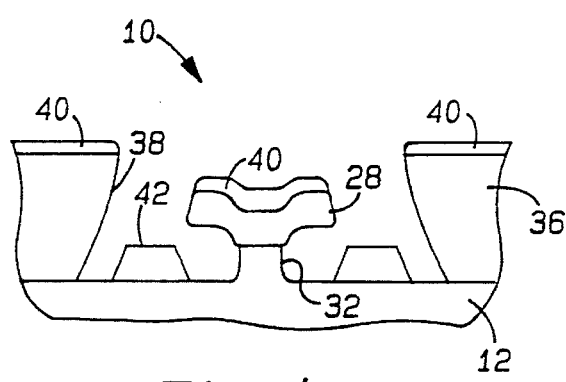

Now turning to FIG. 4, the steps for generating the metal electrode in contact with the lower semiconductor layer 12 will be discussed. A second photoresist layer 36 is deposited over the structure 10. A re-entrant profile opening 38 is formed in the photoresist layer 36 to expose the region of the semiconductor layer 12 which will be metalized. The method of forming the re-entrant profile opening 38 is the same as any of the methods of forming the re-entrant profile opening 22 discussed above. The re-entrant profile opening 38 can completely surround the electrode 28 as shown, or can partially cover the electrode 28. A metal layer 40 is evaporated over the structure 10 such that a portion of the metal layer 40 forms an electrode 42 in contact with the semiconductor layer 12, and a portion of the metal layer 40 is combined with the electrode 28. Note that the electrode 42 appears to be two electrodes. However, for an HBT base electrode, the electrode 42 would be a single electrode surrounding the emitter region 32. That is not to say that this process isn't applicable to forming more than one electrode by a single metalization step.

Figure 5:
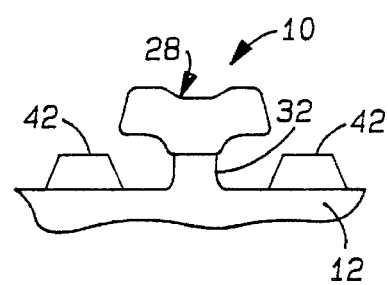

FIG. 5 shows that the photoresist layer 36 has been dissolved to remove the portions of the metal layer 40 which do not form the electrode 42 or the electrode 28. As is apparent from this figure, the edges of the electrode 42 vertically align with the edges of the electrode 28. The amount that the opening 22 in the photoresist layer 20 is enlarged determines the lateral spacing between the semiconductor region 32 and the electrode 42. The thickness of the layer 16 which forms the vertical winged portions 30 of the electrode 28 determines the vertical separation of the electrode 28 and the electrode 42. In this manner, the vertical spacing of the electrodes 28 and 42 and the lateral spacing between semiconductor layer 32 and the electrode 42 can be controlled independently of the thickness of the semiconductor layer 14 or the thickness of the electrode 42.

The process of forming the electrode 42 described above is one way of forming this electrode. Alternately, the electrode 42 can be formed by depositing a metal layer over the entire structure 10 shown in FIG. 3. Then, by using conventional lithography techniques, this metal layer can be patterned and etched by an appropriate wet or dry etch to form the electrode 42 in a manner that is well understood in the art. In this process, a single metalization step can be used to form multiple electrodes.

Figure 6:
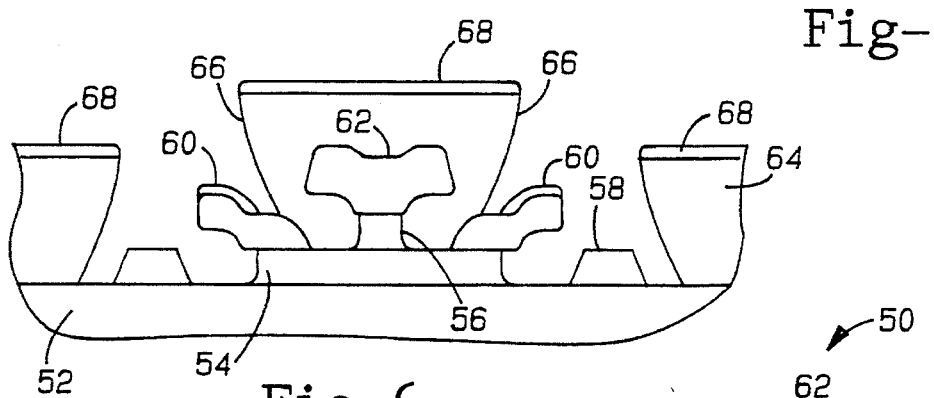
FIGS. 6 and 7 are profile views of a developing semiconductor structure for extending the process of FIGS. 1–5 to three metal electrodes for three semiconductor layers.
Figure 7:
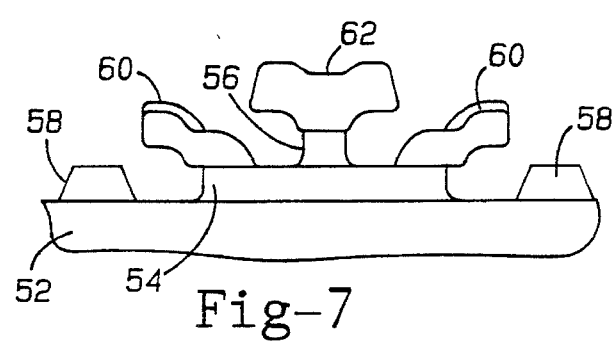

FIGS. 6 and 7 are profile views of a developing semiconductor structure 50 showing how the above-described process can be extended to forming metal electrodes for three semiconductor layers. In FIGS. 6 and 7, the semiconductor structure 50 could also be a heterojunction bipolar transistor. In the structure 50, a semiconductor layer 52 could be a collector layer, a semiconductor layer 54 could be a base layer, and a semiconductor layer 56 could be an emitter layer of an HBT. Likewise, an electrode 58 could be an electrode connected to the collector layer 52, an electrode 60 could be an electrode connected to the base layer 54, and an electrode 62 could be an electrode connected to the emitter layer 56. For this type of configuration, the electrode 62 would be the same as the electrode 28, and the electrode 60 would be the same as the electrode 42.

To form the electrodes as shown, a sacrificial layer (not shown), similar to the sacrificial layer 16 discussed above, would be deposited over the structure 50 after the metal lift-off procedure which removed the metal layer that formed the first electrode 62 and the etch which produced the semiconductor emitter layer 56. In other words, after the structure 50 was in the same condition as that of the structure 10 in FIG. 3, a sacrificial layer would be deposited over this structure, and a photoresist layer would be deposited over the sacrificial layer. The photoresist layer would be patterned to form a re-entrant profile opening which defined the dimensions of the electrode 60 just as the sacrificial layer 16 and photoresist layer 20 defined the dimensions of the electrode 28 discussed above. Note that the electrode 60 also has winged portions similar to the wing portions 30 of the electrode 28. Once this second photoresist layer and sacrificial layer are removed in the same manner as the photoresist layer 20 and the sacrificial layer 16 were removed above, the semiconductor base layer 54 will have been defined as shown. The electrode 62 and a portion of the electrode 60 are protected with a conventionally patterned resist layer to protect the semiconductor emitter layer 56 during the etching of the semiconductor base layer 54.

The procedure for forming the collector electrode 58 would be the same as that as discussed above with reference to FIG. 4. Particularly, as shown in FIG. 6, a third photoresist layer 64 is deposited over the structure 50. Re-entrant profile openings 66 are formed in the photoresist layer 64 to expose the region of the semiconductor collector layer 52 which is to be metalized to produce the electrodes 58. A metal layer 68 is evaporated over the structure 50 such that a portion of the metal layer 68 forms the electrodes 58 in contact with the semiconductor region 52. FIG. 7 shows that the photoresist layer 66 has been dissolved to remove the portions of the metal layer 68 which do not form the electrodes 58. As is apparent from FIG. 7, the edges of the electrode 58 vertically align with the edges of the electrode 60. Note that the electrode 62 and a portion of the electrode 60 would be covered by the third photoresist layer so that the third electrode metal deposition does not reduce the vertical clearance between the electrodes 60 and 62. By following this analysis, it becomes apparent that the above described process can be extended to even more electrodes.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method of forming electrodes associated with different regions of a semiconductor device, said method comprising the steps of:

providing a first semiconductor layer and a second semiconductor layer, said first semiconductor layer being on top of said second semiconductor layer;

providing a first sacrificial layer in contact with the first semiconductor layer and opposite to the second semiconductor layer;

providing a first photoresist layer over the first sacrificial layer opposite to the first semiconductor layer;

forming a first re-entrant profile opening in the first photoresist layer;

forming an opening in the first sacrificial layer through the first re-entrant profile opening of the first photoresist layer to expose the first semiconductor layer;

enlarging the first re-entrant profile opening in the first photoresist layer;

providing a first electrode in contact with the first semiconductor layer; and etching the first sacrificial layer and the first semiconductor layer so as to remove the first sacrificial layer and a portion of the first semiconductor layer so as to form a first semiconductor region beneath and in contact with the first electrode, wherein the step of enlarging the first re-entrant profile opening selectively controls the lateral spacing between the first semiconductor region and a second electrode contacting the second semiconductor layer.

2. The method according to claim 1 wherein the step of providing a first electrode in contact with the first semiconductor layer includes the steps of providing a first metal layer over the first semiconductor layer, the first sacrificial layer and the first photoresist layer, and removing the first photoresist layer so as to remove portions of the first metal layer which do not form the first electrode.

3. The method according to claim 1 further comprising the steps of providing a second photoresist layer over the first electrode and the second semiconductor layer, and forming a second re-entrant profile opening in the second photoresist layer to define the second electrode to be in contact with the second semiconductor layer, said step of forming the second re-entrant profile opening including forming the second re-entrant profile opening which at least partially encloses the first electrode.

4. The method according to claim 3 further comprising the step of providing a second metal layer over the second photoresist layer and the second semiconductor layer so as to form the second electrode in contact with the second semiconductor layer.

5. The method according to claim 4 further comprising the step of removing the second photoresist layer in order to remove portions of the second metal layer which are in contact with the second photoresist layer.

6. The method according to claim 1 further comprising the steps of providing a second metal layer over the first electrode and the second semiconductor layer, and then patterning and etching the second metal layer by a lithography and etching process so as to define the second electrode in contact with the second semiconductor layer.

7. The method according to claim 1 further comprising the steps of providing a second sacrificial layer in contact with the first electrode and the second semiconductor layer, providing a second photoresist layer over the second sacrificial layer, forming a second re-entrant profile opening in the second photoresist layer, forming an opening in the second sacrificial layer through the second re-entrant profile opening of the second photoresist layer in order to expose the second semiconductor layer, enlarging the second re-entrant profile opening, and providing the second electrode in contact with the second semiconductor layer.

8. The method according to claim 7 wherein the step of providing the second electrode in contact with the second semiconductor layer includes the steps of providing a second metal layer such that the second metal layer covers the second semiconductor region, the second sacrificial layer, and the second photoresist layer and removing the second photoresist layer so as to remove portions of the second metal layer which do not form part of the second electrode.

9. The method according to claim 8 further comprising the step of etching the second sacrificial layer and the second semiconductor layer so as to remove the second sacrificial layer and form a second semiconductor region from the second semiconductor layer in contact with the second electrode, said step of etching the second sacrificial layer including using a photoresist layer to protect the first semiconductor region during the etching of the second semiconductor layer.

10. The method according to claim 9 further comprising the steps of providing a third photoresist layer over the first electrode, the second electrode and a third semiconductor layer and forming a third re-entrant profile opening in the third photoresist layer to define a third electrode to be in contact with the third semiconductor layer, said step of forming the third re-entrant profile opening including forming a re-entrant profile opening which at least partially surrounds the second electrode, but does not expose the first electrode and a portion of the second electrode.

11. The method according to claim 10 further comprising the step of providing a third metal layer over the second photoresist layer and the third semiconductor layer so as to form the third electrode in contact with the third semiconductor layer.

12. The method according to claim 11 further comprising the step of removing the third photoresist layer in order to remove the portions of the third metal layer which are in contact with the third photoresist layer.

13. The method according to claim 1 wherein the step of providing a first electrode includes providing extended portions of the first electrode in contact with the first sacrificial layer, wherein the thickness of the first sacrificial layer is chosen to define a vertical distance between the second electrode of the second semiconductor layer and the extended portions of the first electrode.

14. The method according to claim 1 wherein the step of providing a first sacrificial layer includes providing a first sacrificial layer of a dielectric material.

15. A method of forming closely spaced electrodes in contact with different regions of a semiconductor device, said method comprising the steps of:

providing a first semiconductor layer and a second semiconductor layer, said first semiconductor layer being on top of said second semiconductor layer;

providing a first sacrificial layer in contact with the first semiconductor layer and opposite to the second semiconductor layer;

providing a first photoresist layer over the first sacrificial layer opposite to the first semiconductor layer;

forming a first re-entrant profile opening in the first photoresist layer;

forming an opening in the first sacrificial layer through the first re-entrant profile opening of the first photoresist layer to expose the first semiconductor layer;

enlarging the first re-entrant profile opening in the first photoresist layer;

providing a first metal layer over the first semiconductor layer, the first sacrificial layer, and the first photoresist layer so as to form a first electrode within the opening in the first sacrificial layer in contact with the first semiconductor layer;

removing the first photoresist layer so as to remove the portions of first metal layer which do not form the first electrode;

etching the first sacrificial layer and the first semiconductor layer so as to remove the first sacrificial layer and form a first semiconductor region beneath and in contact with the first electrode;

providing a second photoresist layer over the first electrode and the second semiconductor layer;

forming a second re-entrant profile opening in the second photoresist layer to define a second electrode to be in contact with the second semiconductor layer;

providing a second metal layer over the second photoresist layer and the second semiconductor layer so as to form the second electrode in contact with the second semiconductor layer; and removing the second photoresist layer in order to remove portions of the second metal layer which are in contact with the second photoresist layer.

16. The method according to claim 15 wherein the step of providing a first metal layer includes providing extended portions of the first electrode in contact with the first sacrificial layer, and wherein the thickness of the first sacrificial layer is chosen to define a vertical distance between the second electrode and the extended portions of the first electrode.

17. The method according to claim 15 wherein the step of enlarging the first re-entrant profile opening and the step of etching the first semiconductor layer determines the lateral spacing between the first semiconductor region and the second electrode.

18. The method according to claim 15 wherein the step of providing a first sacrificial layer includes providing a first sacrificial layer of a dielectric material.

19. A method of forming closely spaced electrodes in a semiconductor device, said method comprising the steps of:

providing a first semiconductor layer and a second semiconductor layer, said first semiconductor layer being on top of said second semiconductor layer;

providing a sacrificial layer in contact with the first semiconductor layer and opposite to the second semiconductor layer;

providing a photoresist layer over the sacrificial layer opposite to the first semiconductor layer;

forming a re-entrant profile opening in the photoresist layer;

forming an opening in the sacrificial layer through the re-entrant profile opening of the photoresist layer so as to expose the first semiconductor layer;

enlarging the re-entrant profile opening in the photoresist layer, wherein the re-entrant profile opening is enlarged so as to control the lateral spacing between a first semiconductor region formed from the first semiconductor layer and an electrode contacting the second semiconductor layer; and providing an electrode in contact with the first semiconductor layer, wherein the step of providing the sacrificial layer includes providing the sacrificial layer having a thickness that determines the vertical distance between the electrode contacting the first semiconductor layer and the electrode contacting the second semiconductor layer.

20. The method according to claim 19 wherein the step of providing the electrode in contact with the first semiconductor layer includes providing the electrode in contact with the first semiconductor layer that has extended portions that extend along a top surface of the sacrificial layer, wherein the thickness of the sacrificial layer separates the extended portions of the electrode contacting the first semiconductor layer with the electrode contacting the second semiconductor layer.

* * * * *